United States Patent
Hsu et al.

(10) Patent No.: US 12,453,040 B2
(45) Date of Patent: Oct. 21, 2025

(54) FAN MODULE

(71) Applicant: Delta Electronics, Inc., Taoyuan (TW)

(72) Inventors: Kuo-Tung Hsu, Taoyuan (TW);
Wen-Chun Hsu, Taoyuan (TW);
Chao-Fu Yang, Taoyuan (TW);
Shuo-Sheng Hsu, Taoyuan (TW)

(73) Assignee: DELTA ELECTRONICS INC., Taoyuan (TW)

( * ) Notice: Subject to any disclaimer, the term of this patent is extended or adjusted under 35 U.S.C. 154(b) by 199 days.

(21) Appl. No.: 18/333,257

(22) Filed: Jun. 12, 2023

(65) Prior Publication Data
US 2024/0164051 A1 May 16, 2024

(30) Foreign Application Priority Data
Nov. 15, 2022 (CN) .......................... 202223034253.X

(51) Int. Cl.
*H05K 7/20* (2006.01)
(52) U.S. Cl.
CPC ................................ *H05K 7/20172* (2013.01)
(58) Field of Classification Search
CPC . H01L 23/36; H01L 23/4093; H05K 7/20172; H05K 7/20154; H05K 7/20145; H05K 1/0203; H05K 7/20136; H05K 7/20727; H05K 7/20; H05K 7/20863; G06F 1/20; G06F 1/181; G06F 2200/201; F04D 19/002; F04D 19/007; F04D 29/626; F04D 29/646; F04D 29/703; F21V 29/677
See application file for complete search history.

(56) References Cited

U.S. PATENT DOCUMENTS

| | | | | |
|---|---|---|---|---|
| 4,773,829 A * | 9/1988 | Vettori | .................... | F04D 17/16 310/68 R |
| 5,492,458 A * | 2/1996 | Horng | .................... | H02K 1/145 310/216.057 |
| 5,559,674 A * | 9/1996 | Katsui | ................... | H01L 23/467 174/16.3 |
| 6,109,890 A * | 8/2000 | Horng | ................... | F04D 29/626 417/423.15 |

(Continued)

FOREIGN PATENT DOCUMENTS

TW 201113436 A 4/2011

*Primary Examiner* — Michael A Matey
(74) *Attorney, Agent, or Firm* — Muncy, Geissler, Olds & Lowe, P.C.

(57) ABSTRACT

A fan module is adapted to be disposed on a mainboard. The fan module includes a base, a stator unit, a circuit board, a first restriction structure and a second restriction structure. The base includes a mounting shaft and a base opening, wherein the mounting shaft has an axis. The mounting shaft is telescoped in the stator unit. The circuit board is coupled to the stator unit, wherein the circuit board includes a circuit board connection port. The first restriction structure restricts the circuit board, wherein the first restriction structure is arranged on the first straight line, and the first restriction structure is disposed a first distance away from the axis. The second restriction structure restricts the circuit board, wherein the second restriction structure is arranged on the second straight line, the second restriction structure is disposed a second distance away from the axis.

14 Claims, 7 Drawing Sheets

(56) References Cited

U.S. PATENT DOCUMENTS

| | | | | |
|---|---|---|---|---|
| 7,821,789 B1* | 10/2010 | Chou | | H01L 23/467 |
| | | | | 174/16.3 |
| 10,021,775 B1* | 7/2018 | Shen | | H05K 3/0064 |
| 10,231,361 B2 | 3/2019 | Chen et al. | | |
| 2002/0047345 A1* | 4/2002 | Horng | | F04D 25/08 |
| | | | | 310/68 B |
| 2003/0063987 A1* | 4/2003 | Horng | | F04D 29/646 |
| | | | | 417/423.14 |
| 2004/0120833 A1* | 6/2004 | Hsieh | | F04D 29/646 |
| | | | | 417/423.12 |
| 2004/0191095 A1* | 9/2004 | Horng | | H02K 5/1675 |
| | | | | 417/423.1 |
| 2006/0120063 A1* | 6/2006 | Lai | | F04D 25/06 |
| | | | | 362/253 |
| 2008/0157633 A1* | 7/2008 | Yang | | H02K 1/148 |
| | | | | 310/90 |
| 2008/0219838 A1* | 9/2008 | Kusano | | F01D 1/02 |
| | | | | 415/203 |
| 2009/0016914 A1* | 1/2009 | Chen | | F04D 29/626 |
| | | | | 417/423.7 |
| 2009/0185919 A1* | 7/2009 | Yoo | | F04D 29/083 |
| | | | | 310/85 |
| 2011/0085927 A1* | 4/2011 | Su | | F04D 25/0693 |
| | | | | 417/423.14 |
| 2011/0255965 A1* | 10/2011 | Chuang | | F04D 25/0613 |
| | | | | 415/220 |
| 2015/0377241 A1* | 12/2015 | Hoemann | | F04D 25/0646 |
| | | | | 417/423.7 |
| 2018/0003188 A1* | 1/2018 | Nara | | F04D 29/281 |
| 2018/0026495 A1* | 1/2018 | Lu | | H02K 3/47 |
| | | | | 310/71 |
| 2019/0010982 A1* | 1/2019 | Shen | | G06F 1/20 |
| 2019/0048881 A1* | 2/2019 | Byeon | | F04D 17/16 |
| 2019/0085855 A1* | 3/2019 | Horng | | F04D 25/0613 |
| 2019/0101123 A1* | 4/2019 | Matsumura | | H05K 7/20172 |
| 2021/0003136 A1* | 1/2021 | Lu | | F04D 25/0606 |
| 2021/0018009 A1* | 1/2021 | Hsieh | | F04D 25/0693 |
| 2021/0044175 A1* | 2/2021 | Chang | | F04D 25/0613 |
| 2021/0083551 A1* | 3/2021 | Lai | | H02K 11/30 |
| 2022/0341438 A1* | 10/2022 | Luo | | F04D 29/522 |
| 2024/0328426 A1* | 10/2024 | Chu | | F04D 25/0613 |

* cited by examiner

FAN MODULE

CROSS REFERENCE TO RELATED APPLICATIONS

This Application claims priority of China Utility Model Application No. 202223034253.X, filed on Nov. 15, 2022, the entirety of which is incorporated by reference herein.

BACKGROUND OF THE INVENTION

Field of the Invention

The present invention relates to a fan module, and in particular to a fan module without a cable.

Description of the Related Art

The conventional fan module must be coupled to the mainboard of the electronic device via cables and a riser card. However, the cables and riser card increase the production cost and complicate the assembly process. The production efficiency of the electronic device is thus decreased.

BRIEF SUMMARY OF THE INVENTION

Embodiments of the invention are provided to address the aforementioned difficulty.

In one embodiment, a fan module is provided. The fan module is adapted to be disposed on a mainboard. The fan module includes a base, a stator unit, a circuit board, a first restriction structure and a second restriction structure. The base includes a mounting shaft and a base opening, wherein the mounting shaft has an axis. The mounting shaft is telescoped in the stator unit. The circuit board is coupled to the stator unit, wherein the circuit board comprises a circuit board connection port. The first restriction structure restricts the circuit board, wherein the first restriction structure is arranged on the first straight line, and the first restriction structure is disposed a first distance away from the axis. The second restriction structure restricts the circuit board, wherein the second restriction structure is arranged on the second straight line, the second restriction structure is disposed a second distance away from the axis, and the included angle between the first straight line and the second straight line is less than 180 degrees.

In one embodiment, the included angle between the first straight line and the second straight line is greater than 30 degrees.

In one embodiment, the first distance is equal to the second distance.

In one embodiment, the first distance is greater than the second distance.

In one embodiment, the circuit board has a first through hole and a second through hole, the first through hole is arranged on the first straight line, the first through hole is disposed the first distance away from the axis, the second through hole is arranged on the second straight line, and the second through hole is disposed the second distance away from the axis.

In one embodiment, the circuit board connection port comprises a plurality of gold finger contacts.

In one embodiment, the first restriction structure and the second restriction structure are bolts, the first restriction structure affixes the circuit board to the base through the first through hole, and the second restriction structure affixes the circuit board to the base through the second through hole.

In one embodiment, the first restriction structure and the second restriction structure are hooks, the first restriction structure and the second restriction structure are integrally formed on the base, and the first restriction structure and the second restriction structure restrict the circuit board.

In one embodiment, the first restriction structure and the second restriction structure are wedging members, the first restriction structure and the second restriction structure are disposed on the base, the first restriction structure is wedged against the circuit board via the first through hole, and the second restriction structure is wedged against the circuit board via the second through hole.

In one embodiment, a fan module is provided. The fan module is adapted to be disposed on a mainboard. The fan module includes a base, a stator unit, a circuit board, a first restriction structure and a second restriction structure. The base includes a mounting shaft and a base opening, wherein the mounting shaft has an axis. The mounting shaft is telescoped in the stator unit. The circuit board is coupled to the stator unit, wherein the circuit board comprises a circuit board connection port. The first restriction structure restricts the circuit board, wherein the first restriction structure is arranged on the first straight line, and the first restriction structure is disposed a first distance away from the axis. The second restriction structure restricts the circuit board, wherein the second restriction structure is arranged on the second straight line, the second restriction structure is disposed a second distance away from the axis. In the peripheral direction of the base, the first restriction structure and the second restriction structure are located on both sides of the base opening, the mainboard comprises a mainboard body and a mainboard connection port, the mainboard connection port is disposed on the mainboard body, and the mainboard connection port is coupled to the circuit connection port via the base opening without a cable.

In one embodiment, the circuit board connection port comprises a plurality of gold finger contacts, the mainboard connection port comprises a plurality of elastic sheets, and the elastic sheets abut the gold finger contacts.

In one embodiment, the base comprises a recess, the circuit board corresponds to the recess, and the first restriction structure and the second restriction structure are formed on the edge of the recess.

In one embodiment, the circuit board has a first through hole and a second through hole, the first through hole is arranged on the first straight line, the first through hole is disposed the first distance away from the axis, the second through hole is arranged on the second straight line, and the second through hole is disposed the second distance away from the axis, the base comprises a first stage and a second stage, the first stage corresponds to the first through hole, the second stage corresponds to the second through hole, the first stage and the second stage abut one side of the circuit board, the first restriction structure and the second restriction structure are bolts, the first restriction structure passes through the first through hole and connects the first stage to affix the circuit board to the base, and the second restriction structure passes through the second through hole and connects the second stage to affix the circuit board to the base.

In the fan module of the embodiment of the invention, the mainboard connection port is coupled to the circuit connection port via the base opening without a cable. The cable and riser card of the conventional art are omitted, and the cost is thus decreased. The time and effort required for assembly are reduced, and the manufacturing efficiency is raised.

Additionally, in one embodiment, the first restriction structure and the second restriction structure restrict the circuit board is an asymmetrical way. The circuit board is prevented from deformed by the mainboard connection port, and the reliability of the product is improved.

In one embodiment, the gold finger contacts correspond to the elastic sheets. The layout on the circuit board is prevented from being interfered with the electronic/mechanical components, and the circuit board is prevented from being deformed. Utilizing the fan module of the embodiment of the invention, the axial/radial position of the circuit board can be restricted via the asymmetrical locking (by screw or thermal fusion).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
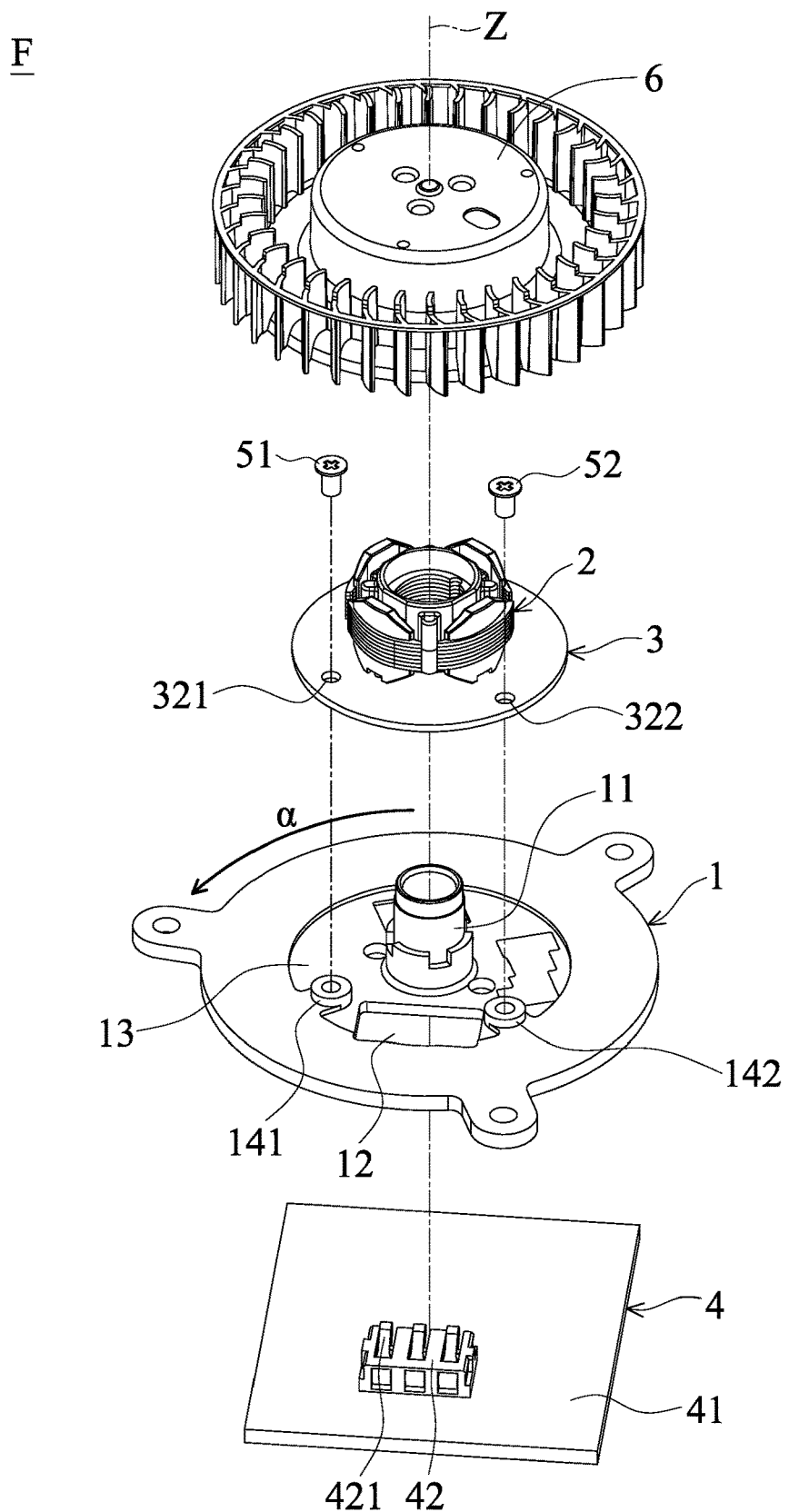
FIG. 1A is an exploded view of the fan module of a first embodiment of the invention.
Figure 1B:
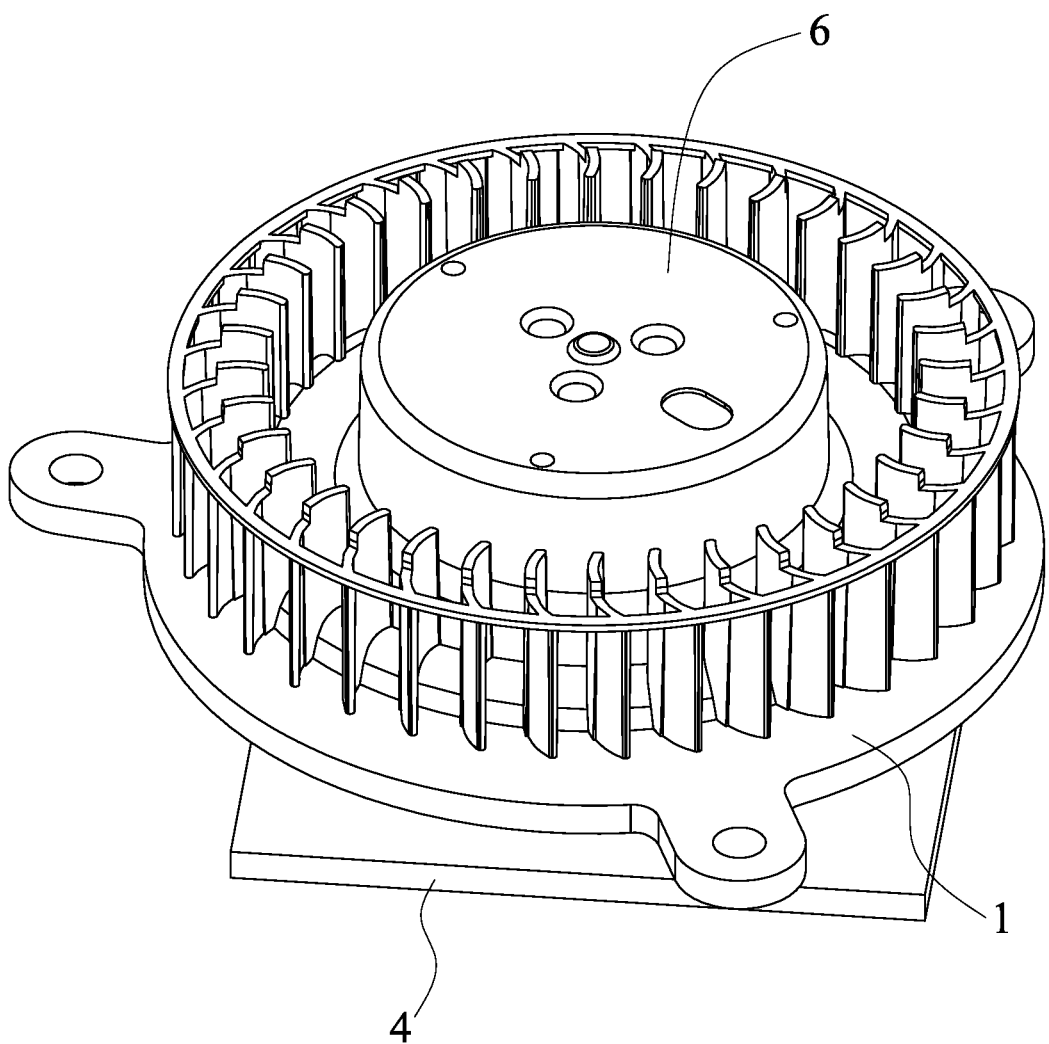
FIG. 1B is an assembled view of the fan module of the first embodiment of the invention.

FIG. 1A is an exploded view of the fan module of a first embodiment of the invention. FIG. 1B is an assembled view of the fan module of the first embodiment of the invention. With reference to FIGS. 1A and 1B, the fan module F of the embodiment of the invention is adapted to be disposed on a mainboard 4. The fan module F includes a base 1, a stator unit 2, a circuit board 3, a blade unit (including a rotor) 6, a first restriction structure 51 and a second restriction structure 52. The base 1 includes a mounting shaft 11 and a base opening 12, wherein the mounting shaft 11 has an axis Z. The mounting shaft 11 is telescoped in the stator unit 2. The circuit board 3 is coupled to the stator unit 2. The blade unit (including a rotor) 6 is telescoped on the stator unit 2.

Figure 2A:
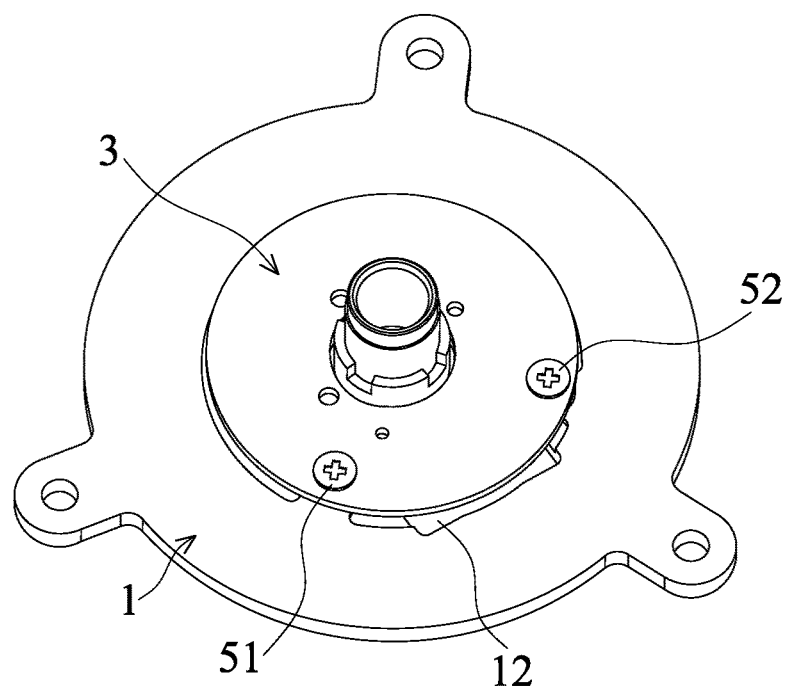
FIG. 2A shows the circuit board of the first embodiment of the invention combined with the base.
Figure 2B:
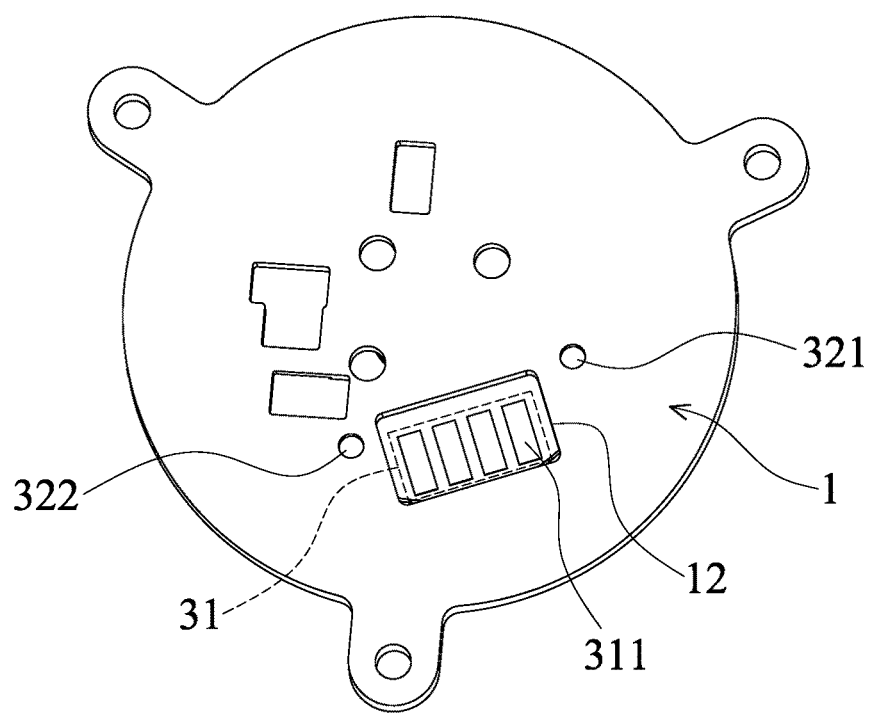
FIG. 2B shows a circuit board connection port of the first embodiment of the invention.

FIG. 2A shows the circuit board of the first embodiment of the invention combined with the base. FIG. 2B shows a circuit board connection port of the first embodiment of the invention. With reference to FIGS. 1A, 1B, 2A and 2B, the circuit board 3 comprises a circuit board connection port 31. The mainboard 4 comprises a mainboard body 41 and a mainboard connection port 42. The mainboard connection port 42 is disposed on the mainboard body 41. The mainboard connection port 42 is coupled to the circuit connection port 31 via the base opening 12 without a cable.

Figure 3:
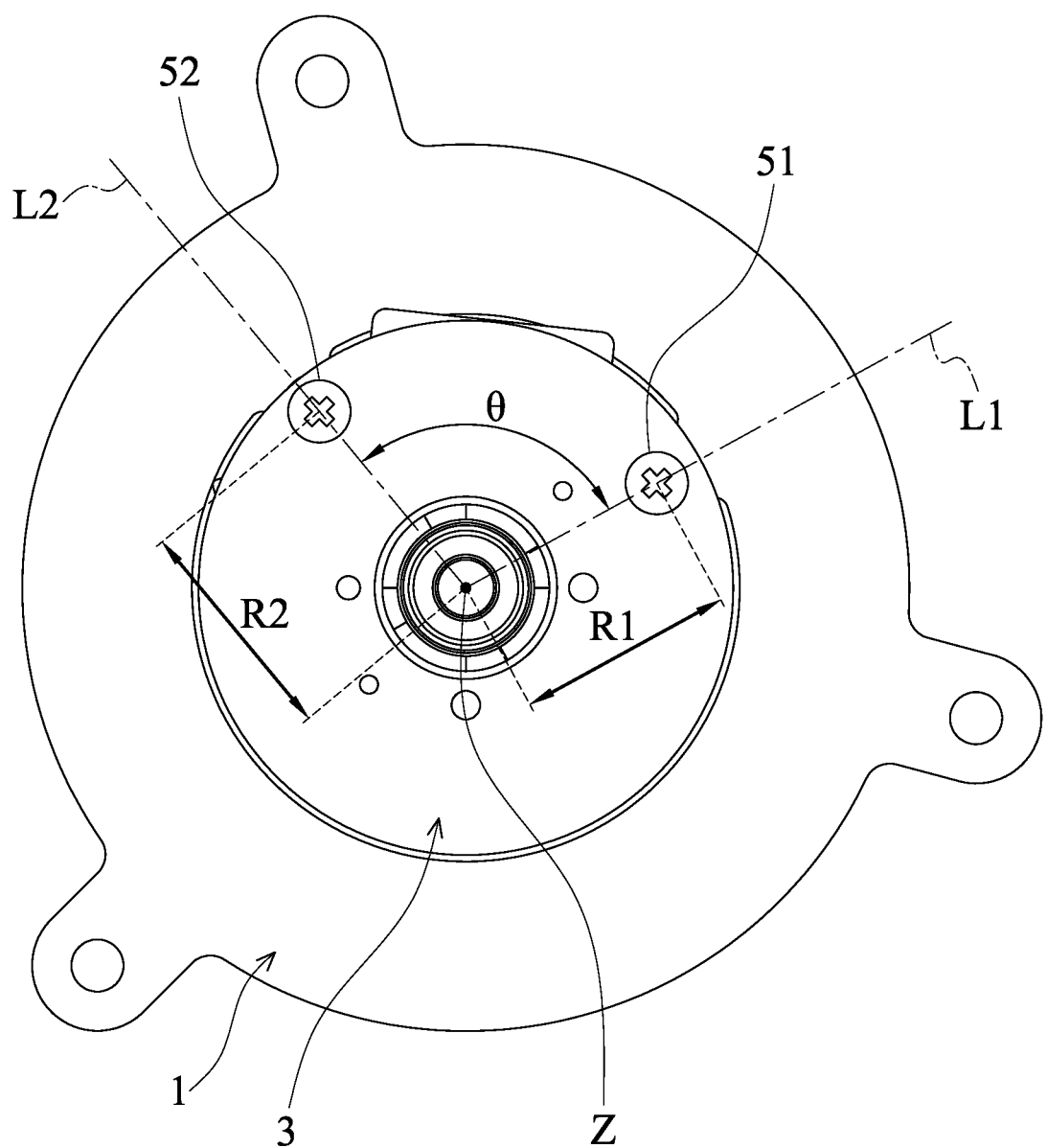
FIG. 3 shows the position of the first restriction structure and the second restriction structure of the first embodiment of the invention.

FIG. 3 shows the position of the first restriction structure and the second restriction structure of the first embodiment of the invention. With reference to FIGS. 1A and 3, the first restriction structure 51 corresponds to the first through hole 321 of the circuit board 3 and restricts the circuit board 3. The second restriction structure 52 corresponds to the second through hole 322 of the circuit board 3 and restricts the circuit board 3. The first through hole 321 is arranged on the first straight line L1, and the first through hole 321 is disposed the first distance R1 away from and the axis Z. The second through hole 322 is arranged on the second straight line L2, the second through hole 322 is disposed the second distance R2 away from the axis Z. The included angle θ between the first straight line L1 and the second straight line L2 is less than 180 degrees.

With reference to FIG. 3, in one embodiment, the included angle θ formed between the first straight line L1 and the second straight line L2 is greater than 30 degrees.

With reference to FIG. 3, in one embodiment, the first distance R1 is greater than the second distance R2 (asymmetrical restriction). In another embodiment, the first distance R1 can equal to the second distance R2. The disclosure is not meant to restrict the invention.

With reference to FIG. 2B, in one embodiment, the circuit board connection port 31 comprises a plurality of gold finger contacts 311.

With reference to FIGS. 1A and 2B, in one embodiment, the mainboard connection port 42 comprises a plurality of elastic sheets 421, and the elastic sheets 421 abut the gold finger contacts 311.

Figure 4:
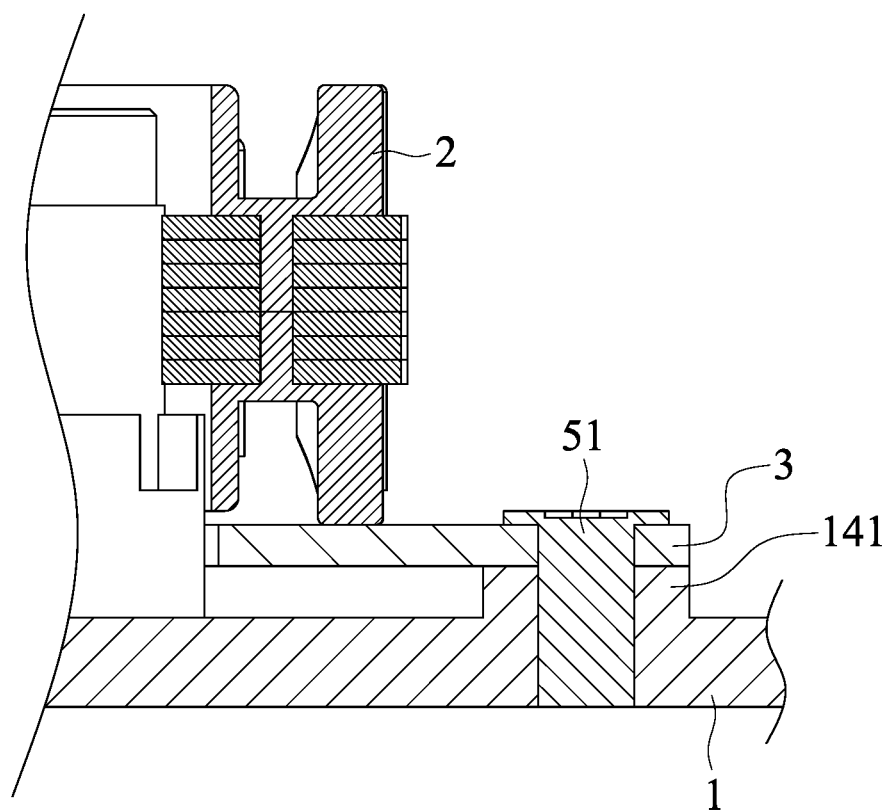
FIG. 4 is a cross sectional view of the restriction structure of the first embodiment of the invention.

FIG. 4 is a cross sectional view of the restriction structure of the first embodiment of the invention. With reference to FIGS. 1A, 2A and 4, in one embodiment, the first restriction structure 51 and the second restriction structure 52 are bolts. The first restriction structure 51 and the second restriction structure 52 affix the circuit board 3 to the base 1. The disclosure is not meant to restrict the invention. For example, the first restriction structure 51 and the second restriction structure 52 can be hot melt members or other restriction means.

With reference to FIGS. 1A, 2A and 2B, the mainboard connection port 42 is coupled to the circuit connection port 31 via the base opening 12 without a cable. In the peripheral direction a of the base 1, the first restriction structure 51 and the second restriction structure 52 are located on both sides of the base opening 12.

With reference to FIGS. 1A, 2A, 2B and 4, in one embodiment, the base 1 comprises a recess 13. The circuit board 3 corresponds to the recess 13. The first restriction structure 51 and the second restriction structure 52 are formed on the edge of the recess 13. In one embodiment, the base 1 comprises a first stage 141 and a second stage 142. The first stage 141 corresponds to the first through hole 321. The second stage 142 corresponds to the second through hole 322. The first stage 141 and the second stage 142 abut one side of the circuit board 3. The first restriction structure 51 and the second restriction structure 52 are bolts. The first restriction structure 51 passes through the first through hole 321 and connects the first stage 141 to affix the circuit board 3 to the base 1. The second restriction structure 52 passes through the second through hole 322 and connects the second stage 142 to affix the circuit board 3 to the base 1.

With reference to FIGS. 1A and 1B, in one embodiment, the stator unit 2 is connected to the mounting shaft by glue. The stator unit 2 is welded to the circuit board 3. The disclosure is not meant to restrict the invention. For example, the stator unit 2 can be connected to the mounting shaft 11 by thread.

Figure 5A:
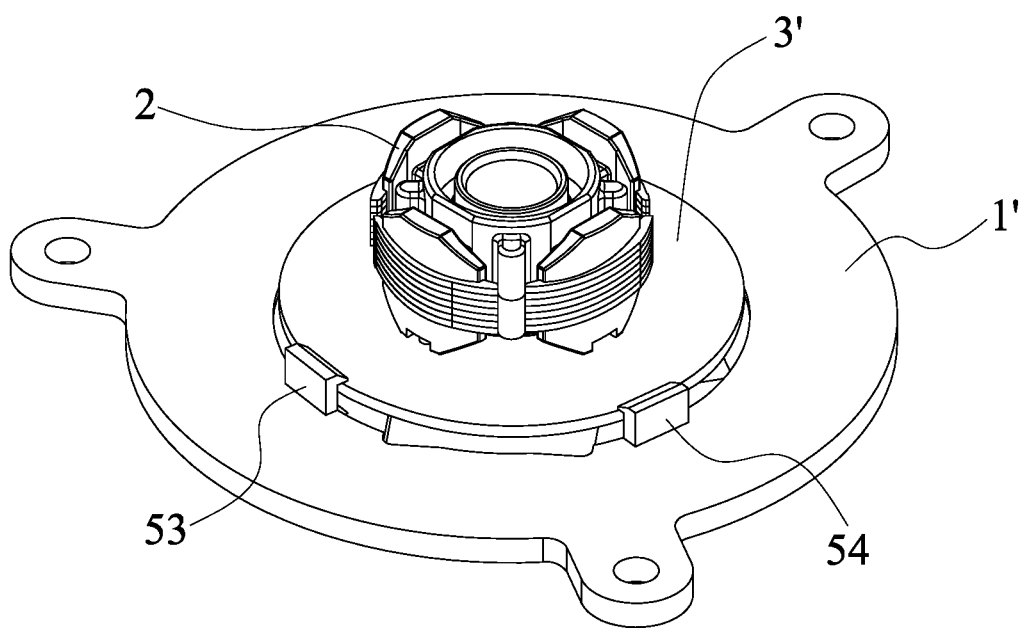
FIG. 5A shows a portion of a fan module of a second embodiment of the invention.
Figure 5B:
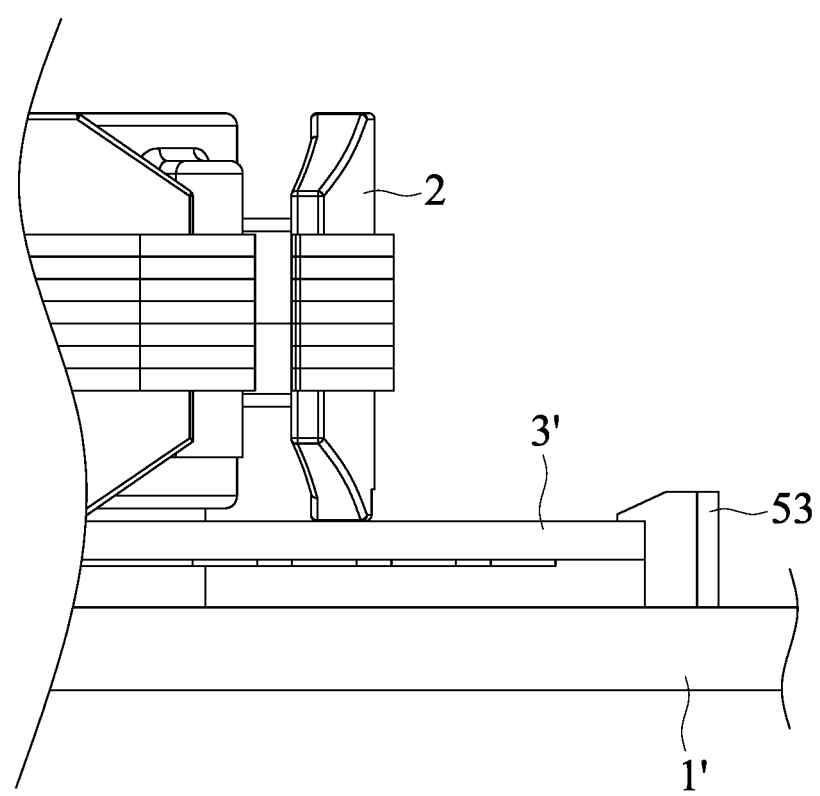
FIG. 5B is a cross sectional view of a restriction structure of the second embodiment of the invention.

FIG. 5A shows a portion of a fan module of a second embodiment of the invention. FIG. 5B is a cross sectional view of a restriction structure of the second embodiment of the invention. With reference to FIGS. 5A and 5B, in one embodiment, the first restriction structure 53 and the second restriction structure 54 are hooks. The first restriction structure 53 and the second restriction structure 54 are integrally formed on the base 1'. The first restriction structure 53 and the second restriction structure 54 restrict the circuit board 3'. In this embodiment, the first restriction structure 53 and the second restriction structure 54 abut the edge of the circuit board 3' to restrict the circuit board 3'.

Figure 6:
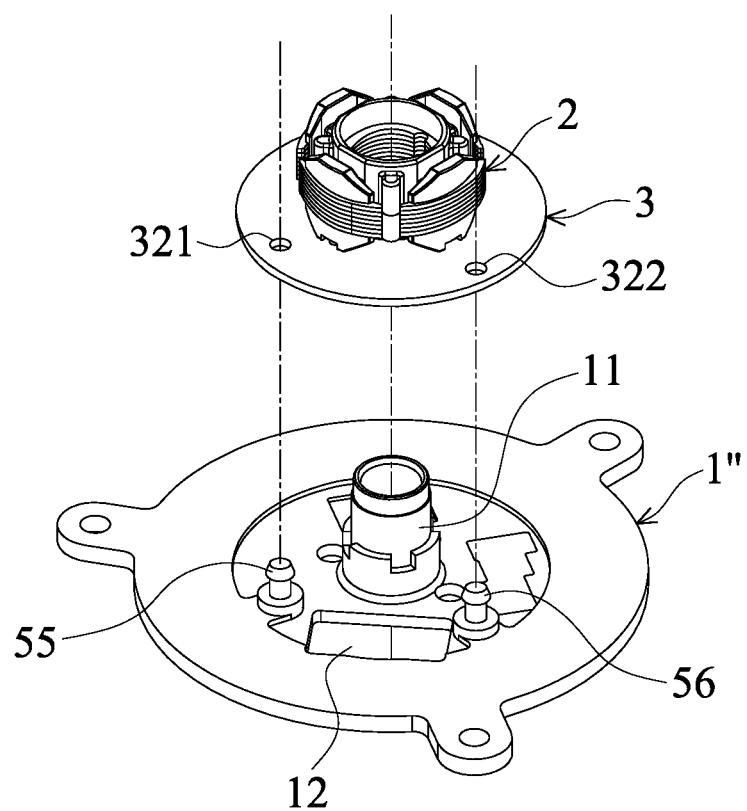
FIG. 6 shows a portion of a fan module of a third embodiment of the invention.

FIG. 6 shows a portion of a fan module of a third embodiment of the invention. With reference to FIG. 6, in this embodiment, the first restriction structure 55 and the second restriction structure 56 are wedging members. The first restriction structure 55 and the second restriction structure 56 are disposed on the base 1" and restrict the circuit board 3. In this embodiment, the first restriction structure 55 is wedged against the circuit board 3 via the first through hole 321, and the second restriction structure 56 is wedged against the circuit board 3 via the second through hole 322.

In the fan module of the embodiment of the invention, the mainboard connection port is coupled to the circuit connection port via the base opening without a cable. The cable and riser card of the conventional art are omitted, and the cost is thus decreased. The time and effort required for assembly are reduced, and the manufacturing efficiency is raised. Additionally, in one embodiment, the first restriction structure and the second restriction structure restrict the circuit board is an asymmetrical way. The circuit board is prevented from deformed by the mainboard connection port, and the reliability of the product is improved.

In one embodiment, the gold finger contacts correspond to the elastic sheets. The layout on the circuit board is prevented from being interfered with the electronic/mechanical components, and the circuit board is prevented from being deformed. Utilizing the fan module of the embodiment of the invention, the axial/radial position of the circuit board can be restricted via the asymmetrical locking (by screw or thermal fusion).

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fan module, adapted to be disposed on a mainboard and to be connected to a mainboard connection port of the mainboard, comprising:
    a base, comprising a mounting shaft and a base opening, wherein the mounting shaft has an axis;
    a stator unit, wherein the mounting shaft is telescoped in the stator unit;
    a circuit board, coupled to the stator unit, wherein the circuit board comprises a circuit board connection port facing to the base opening, and the mainboard connection port is coupled to the circuit board connection port through via the base opening without a cable;
    a first restriction structure, restricting the circuit board, wherein the first restriction structure is adjacent to one side of the base opening, the first restriction structure is arranged on a first straight line, and the first restriction structure is disposed a first distance away from the axis; and
    a second restriction structure, restricting the circuit board, wherein the second restriction structure is adjacent to another side of the base opening, the second restriction structure is arranged on a second straight line, the second restriction structure is disposed a second distance away from the axis, and an included angle between the first straight line and the second straight line is less than 180 degrees and greater than 30 degrees.

2. The fan module as claimed in claim 1, wherein the first distance is equal to the second distance.

3. The fan module as claimed in claim 1, wherein the first distance is greater than the second distance.

4. The fan module as claimed in claim 1, wherein the circuit board has a first through hole and a second through hole, the first through hole is arranged on the first straight line, the first through hole is disposed the first distance away from the axis, the second through hole is arranged on the second straight line, and the second through hole is disposed the second distance away from the axis.

5. The fan module as claimed in claim 4, wherein the first restriction structure and the second restriction structure are bolts, the first restriction structure affixes the circuit board to the base through the first through hole, and the second restriction structure affixes the circuit board to the base through the second through hole.

6. The fan module as claimed in claim 4, wherein the first restriction structure and the second restriction structure are wedging posts, the first restriction structure and the second restriction structure are disposed on the base, the first restriction structure is wedged against the circuit board via the first through hole, and the second restriction structure is wedged against the circuit board via the second through hole.

7. The fan module as claimed in claim 1, wherein the circuit board connection port comprises a plurality of gold finger contacts.

8. The fan module as claimed in claim 1, wherein the first restriction structure and the second restriction structure are hooks, the first restriction structure and the second restriction structure are integrally formed on the base, and the first restriction structure and the second restriction structure restrict the circuit board.

9. A fan module, adapted to be disposed on a mainboard and to be connected to a mainboard connection port of the mainboard, comprising:
    a base, comprising a mounting shaft and a base opening, wherein the mounting shaft has an axis;

a stator unit, wherein the mounting shaft is telescoped in the stator unit;

a circuit board, coupled to the stator unit, wherein the circuit board comprises a circuit board connection port facing to the base opening, and the mainboard connection port is coupled to the circuit board connection port through via the base opening without a cable;

a first restriction structure, restricting the circuit board, wherein the first restriction structure is adjacent to one side of the base opening, the first restriction structure is arranged on a first straight line, and the first restriction structure is disposed a first distance away from the axis; and a second restriction structure, restricting the circuit board, wherein the second restriction structure is adjacent to another side of the base opening, the second restriction structure is arranged on a second straight line, the second restriction structure is disposed a second distance away from the axis, and an included angle between the first straight line and the second straight line is less than 180 degrees and greater than 30 degrees, wherein in a peripheral direction of the base, the first restriction structure and the second restriction structure are located on both sides of the base opening, the mainboard comprises a mainboard body, and the mainboard connection port is disposed on the mainboard body.

10. The fan module as claimed in claim 9, wherein the circuit board connection port comprises a plurality of gold finger contacts, the mainboard connection port comprises a plurality of elastic sheets, and the elastic sheets abut the gold finger contacts.

11. The fan module as claimed in claim 9, wherein the base comprises a recess, the circuit board corresponds to the recess, and the first restriction structure and the second restriction structure are formed on an edge of the recess.

12. The fan module as claimed in claim 9, wherein the circuit board has a first through hole and a second through hole, the first through hole is arranged on the first straight line, the first through hole is disposed the first distance away from the axis, the second through hole is arranged on the second straight line, and the second through hole is disposed the second distance away from the axis, the base comprises a first stage and a second stage, the first stage corresponds to the first through hole, the second stage corresponds to the second through hole, the first stage and the second stage abut one side of the circuit board, the first restriction structure and the second restriction structure are bolts, the first restriction structure passes through the first through hole and connects the first stage to affix the circuit board to the base, and the second restriction structure passes through the second through hole and connects the second stage to affix the circuit board to the base.

13. The fan module as claimed in claim 9, wherein the first restriction structure and the second restriction structure are hooks, the first restriction structure and the second restriction structure are integrally formed on the base, and the first restriction structure and the second restriction structure restrict the circuit board.

14. The fan module as claimed in claim 9, wherein the first restriction structure and the second restriction structure are wedging posts, the first restriction structure and the second restriction structure are disposed on the base, the first restriction structure is wedged against the circuit board via the first through hole of the circuit board, and the second restriction structure is wedged against the circuit board via the second through hole of the circuit board.

\* \* \* \* \*